United States Patent
Shur et al.

(10) Patent No.: US 10,587,096 B2
(45) Date of Patent: Mar. 10, 2020

(54) ACCESS RESISTANCE MODULATED SOLID-STATE LIGHT SOURCE

(71) Applicant: Sensor Electronic Technology, Inc., Columbia, SC (US)

(72) Inventors: Michael Shur, Latham, NY (US); Grigory Simin, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 22 days.

(21) Appl. No.: 15/444,735

(22) Filed: Feb. 28, 2017

(65) Prior Publication Data

US 2017/0251533 A1    Aug. 31, 2017

Related U.S. Application Data

(60) Provisional application No. 62/301,041, filed on Feb. 29, 2016.

(51) Int. Cl.
| | |
|---|---|
| *H01S 5/30* | (2006.01) |
| *H01L 33/14* | (2010.01) |
| *H01L 33/32* | (2010.01) |
| *H01L 33/06* | (2010.01) |
| *H01S 5/042* | (2006.01) |
| *H01S 5/062* | (2006.01) |
| *H01L 33/36* | (2010.01) |
| *H01S 5/06* | (2006.01) |

(52) U.S. Cl.
CPC ............ *H01S 5/3013* (2013.01); *H01L 33/06* (2013.01); *H01L 33/14* (2013.01); *H01L 33/32* (2013.01); *H01L 33/36* (2013.01); *H01S 5/0425* (2013.01); *H01S 5/0427* (2013.01); *H01S 5/0614* (2013.01); *H01S 5/06203* (2013.01)

(58) Field of Classification Search
CPC .. H01S 5/06203; H01S 5/0614; H01S 5/3013; H01L 33/36
See application file for complete search history.

(56) References Cited

U.S. PATENT DOCUMENTS

| | | | | |
|---|---|---|---|---|
| 6,040,590 | A * | 3/2000 | OBrien ................. | H01S 5/0614 257/94 |
| 6,128,324 | A * | 10/2000 | Shah ...................... | H01S 5/062 257/134 |
| 2002/0051473 | A1* | 5/2002 | Katoda ................. | H01L 27/088 372/36 |
| 2017/0077085 | A1 | 3/2017 | Simin et al. | |
| 2017/0079102 | A1 | 3/2017 | Simin et al. | |
| 2017/0196061 | A1 | 7/2017 | Simin et al. | |
| 2017/0219854 | A1 | 8/2017 | Simin et al. | |

* cited by examiner

*Primary Examiner* — Jamie C Niesz
(74) *Attorney, Agent, or Firm* — LaBatt, LLC

(57) ABSTRACT

A solid-state light source with built-in access resistance modulation is described. The light source can include an active region configured to emit electromagnetic radiation during operation of the light source. The active region can be formed at a p-n junction of a p-type side with a p-type contact and a n-type side with a n-type contact. The light source includes a control electrode configured to modulate an access resistance of an access region located on the p-type side and/or an access resistance of an access region located on the n-type side of the active region. The solid-state light source can be implemented in a circuit, which includes a voltage source that supplies a modulation voltage to the control electrode to modulate the access resistance(s).

20 Claims, 9 Drawing Sheets

ACCESS RESISTANCE MODULATED SOLID-STATE LIGHT SOURCE

REFERENCE TO RELATED APPLICATIONS

The current application claims the benefit of U.S. Provisional Application No. 62/301,041, which was filed on 29 Feb. 2016, and which is hereby incorporated by reference.

TECHNICAL FIELD

The disclosure relates generally to solid-state light sources, and more particularly, to a solid-state light source with access resistance modulation.

BACKGROUND ART

A great deal of interest has been focused on solid-state light sources (SSLSs), such as LEDs and lasers, and in particular, those that emit light in the blue and deep ultraviolet (UV) wavelengths. These devices may be capable of being incorporated into various applications, including solid-state lighting, biochemical disinfection and detection, high-density data storage, and the like.

Modern SSLSs, such as an LEDs, typically include three major components: an electron supply layer (e.g., a n-type semiconductor layer), a hole supply layer (e.g., a p-type semiconductor layer), and a light generating structure formed between the electron supply layer and the hole supply layer. A number of these SSLSs are used in applications that require a fast on/off switching time of the SSLSs, such as in a nanosecond or sub-nanosecond range.

Attempts to achieve fast light modulation use external current modulators (drivers) or external light modulators with the SSLSs. FIG. 1 shows an illustrative circuit diagram for an LED driver/modulator according to the prior art, while FIG. 2 shows an illustrative external optical modulator according to the prior art. However, using external driver circuits results in parasitic parameters, which limit the modulation time and cause ringing and optical pulse distortions. Additionally, the external driver circuits as weight and cost to the SSLS system. Modulation with an external light modulator incurs additional optical loss, power consumption, and leads to significant increase in the overall size, weight and cost of the SSLS devices.

SUMMARY OF THE INVENTION

Aspects of the invention provide a solid-state light source with built-in access resistance modulation. The light source can include an active region configured to emit electromagnetic radiation during operation of the light source. The active region can be formed at a p-n junction of a p-type side with a p-type contact and a n-type side with a n-type contact. The light source includes a control electrode configured to modulate an access resistance of an access region located on the p-type side and/or an access resistance of an access region located on the n-type side of the active region. The solid-state light source can be implemented in a circuit, which includes a voltage source that supplies a modulation voltage to the control electrode to modulate the access resistance(s).

A first aspect of the invention provides a solid-state light source comprising: an active region configured to emit electromagnetic radiation during operation of the light source; a n-type contact located on a n-type side of the active region and separated from the active region by a n-type access region; a p-type contact located on a p-type side of the active region and separated from the active region by a p-type access region; and a control electrode configured to modulate at least one of: an access resistance of the n-type access region or an access resistance of the p-type access region.

A second aspect of the invention provides a circuit comprising: a solid-state light source comprising: an active region configured to emit electromagnetic radiation during operation of the light source; a n-type contact located on a n-type side of the active region and separated from the active region by a n-type access region; a p-type contact located on a p-type side of the active region and separated from the active region by a p-type access region; and a control electrode configured to modulate at least one of: an access resistance of the n-type access region or an access resistance of the p-type access region; and a voltage source electrically connected to the control electrode, wherein the voltage source supplies a modulation voltage to the control electrode to modulate the at least one of: the access resistance of the n-type access region or the access resistance of the p-type access region.

A third aspect of the invention provides a solid-state light source comprising: a first semiconductor layer; an active region configured to emit electromagnetic radiation during operation of the light source, the active region located only on a first portion of the first semiconductor layer; a second semiconductor layer located on the active region, wherein the first semiconductor layer is one of: a n-type semiconductor or a p-type semiconductor, and wherein the second semiconductor layers is the other of: the n-type semiconductor or the p-type semiconductor; and a control electrode configured to modulate an access resistance of an access region of the first semiconductor layer.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a solid-state light source with built-in access resistance modulation. The light source can include an active region configured to emit electromagnetic radiation during operation of the light source. The active region can be formed at a p-n junction of a p-type side with a p-type contact and a n-type side with a n-type contact. The light source includes a control electrode configured to modulate an access resistance of an access region located on the p-type side and/or an access resistance of an access region located on the n-type side of the active region. The solid-state light source can be implemented in a circuit, which includes a voltage source that supplies a modulation voltage to the control electrode to modulate the access resistance(s).

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range.

As used herein, a solid-state light source (SSLS) is any device, such as a diode that, under normal operating conditions, operates in a forward-bias mode. The SSLS can include a multitude of SSLSs such as for example, a p-n junction SSLS, a multiple-quantum well SSLS and a heterojunction SSLS. In one embodiment, the SSLS can include any type of semiconductor LED such as conventional and super luminescent LEDs, ultraviolet LEDs, light emitting solid state lasers, laser diodes, ultraviolet laser diodes, and/or the like. These examples of SSLSs can be configured to emit electromagnetic radiation from an active region, such as a light generating structure, upon application of a bias. In particular, electron-hole pair recombination in a p-n junction active region can lead to the emission of electromagnetic radiation. The electromagnetic radiation emitted by these SSLSs can comprise a peak wavelength within any range of wavelengths, including visible light, ultraviolet radiation, deep ultraviolet radiation, infrared light, and/or the like. For example, these SSLSs can emit radiation having a dominant wavelength within the ultraviolet range of wavelengths. As an illustration, the dominant wavelength can be within a range of wavelengths of approximately 210 nanometers (nm) to approximately 350 nm.

Figure 1:
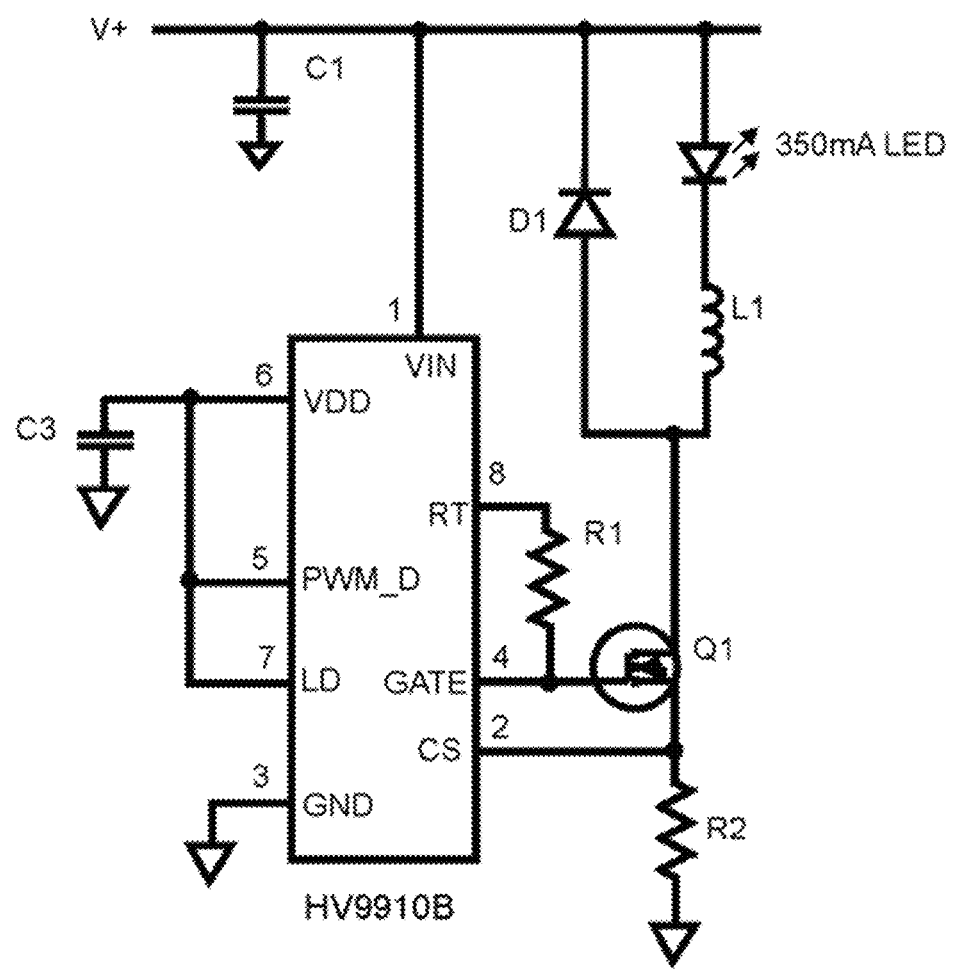
FIG. 1 shows an illustrative circuit diagram for an LED driver/modulator according to the prior art.
Figure 2:
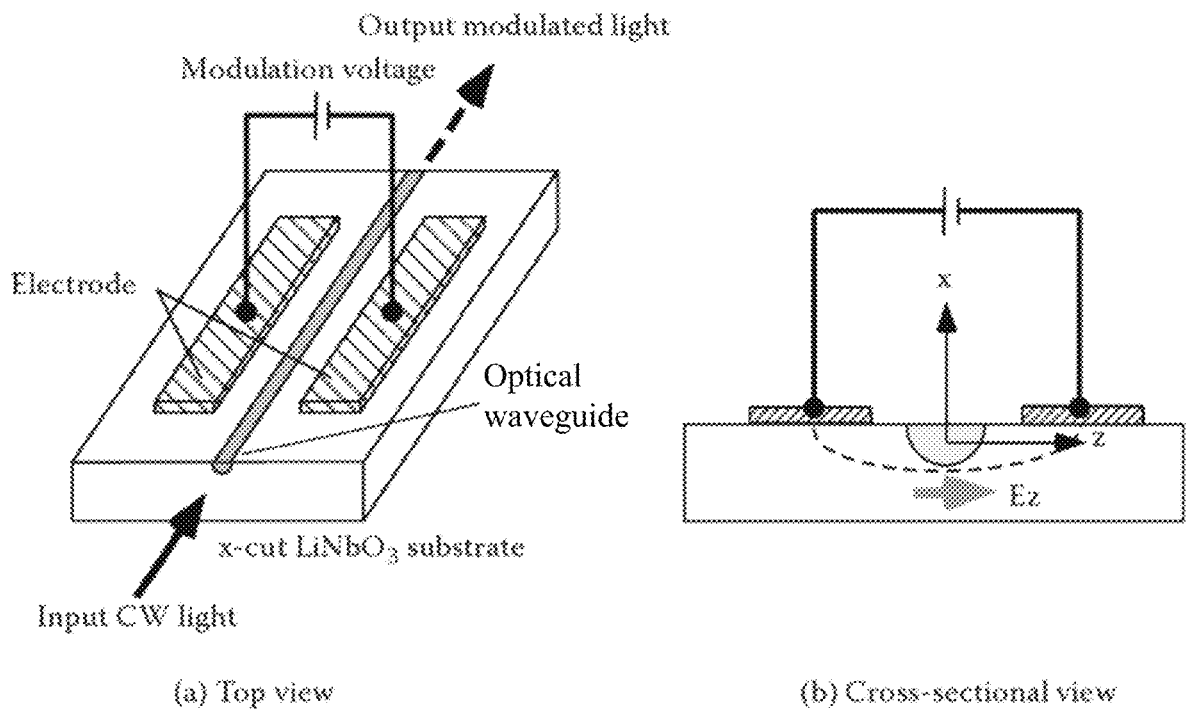
FIG. 2 shows an illustrative external optical modulator according to the prior art.
Figure 3:
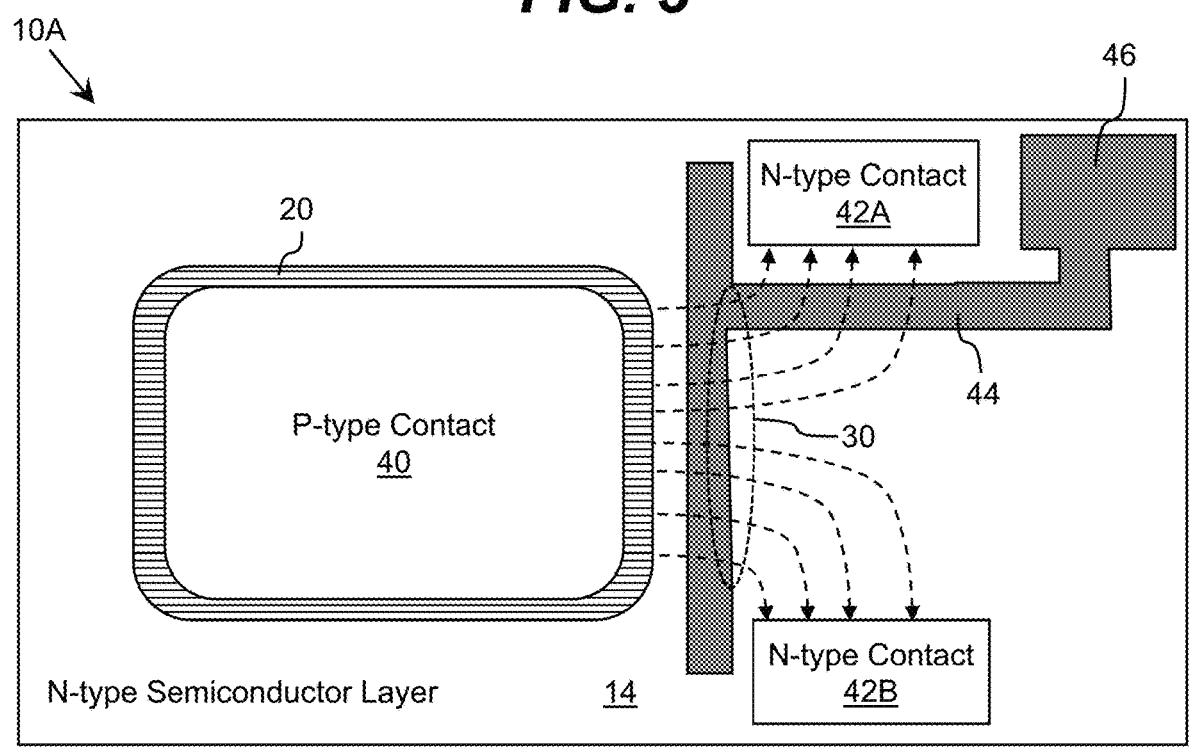
FIG. 3 shows a schematic top view of an illustrative solid-state light source (SSLS) according to an embodiment.

Turning to the drawings, FIG. 3 shows a schematic top view of an illustrative solid-state light source (SSLS) 10A according to an embodiment. As illustrated, the SSLS 10A includes a n-type semiconductor layer 14 on which a p-type mesa 20 is formed. The p-type mesa can include an active (e.g., light emitting) region, and comprise a p-type current supplying contact 40 (e.g., anode) formed on a top surface thereof. Furthermore, the SSLS 10A is shown including a pair of n-type current supplying contacts 42A, 42B (e.g., cathodes) formed on the surface of the n-type semiconductor layer 14. In an embodiment, a contact 40, 42A, 42B can comprise an electrode. While one p-type contact 40 and two n-type contacts 42A, 42B are illustrated, it is understood that embodiments of the SSLS described herein can include any combination of one or more p-type contacts and one or more n-type contacts.

During operation of the SSLS 10A, the current flow in a n-type access region of the SSLS 10A can exhibit a current spreading pattern as illustrated by the pump current paths 30. As used herein, an access region is the portion of the SSLS 10A located between one or more current supplying contacts (e.g., the p-type contact 40 and the n-type contacts 42A, 42B) and the active region, which can be located in the p-type mesa 20 in this embodiment. To this extent, a SSLS described herein will comprise a n-type access region located between the n-type contact(s) 42A, 42B and the active region, and a p-type access region located between the p-type contact(s) 40 and the active region. An amount of current flowing into the active region depends on the access resistances of the semiconductor materials located in the p-type and n-type access regions, located between the respective current supplying contact(s) and the active region.

The SSLS 10A is shown including a control electrode 44, which is electrostatically coupled to the n-type access region of the SSLS 10A. In particular, the control electrode 44 is formed on the n-type semiconductor layer 14 over the n-type access region of the SSLS 10A. The control electrode 44 can include a pad 46, which can be used to apply a modulation voltage to the control electrode 44. The modulation voltage applied to the control electrode 44 can be used to modulate the access resistance of the access region of the SSLS 10A. In this manner, current spreading to the active region of the SSLS 10A (e.g., current spreading between the n-type contacts 42A, 42B and the p-type mesa 20) can be modulated. As illustrated, the control electrode 44 can have at least one dimension that extends at least over an entire portion of the access region in which the current spreading occurs between the contact(s) and the active region during operation of the SSLS 10A. To this extent, as illustrated in FIG. 3, a portion of the control electrode 44 can be located over each of the pump current paths 30 in at least one location.

Figure 4:
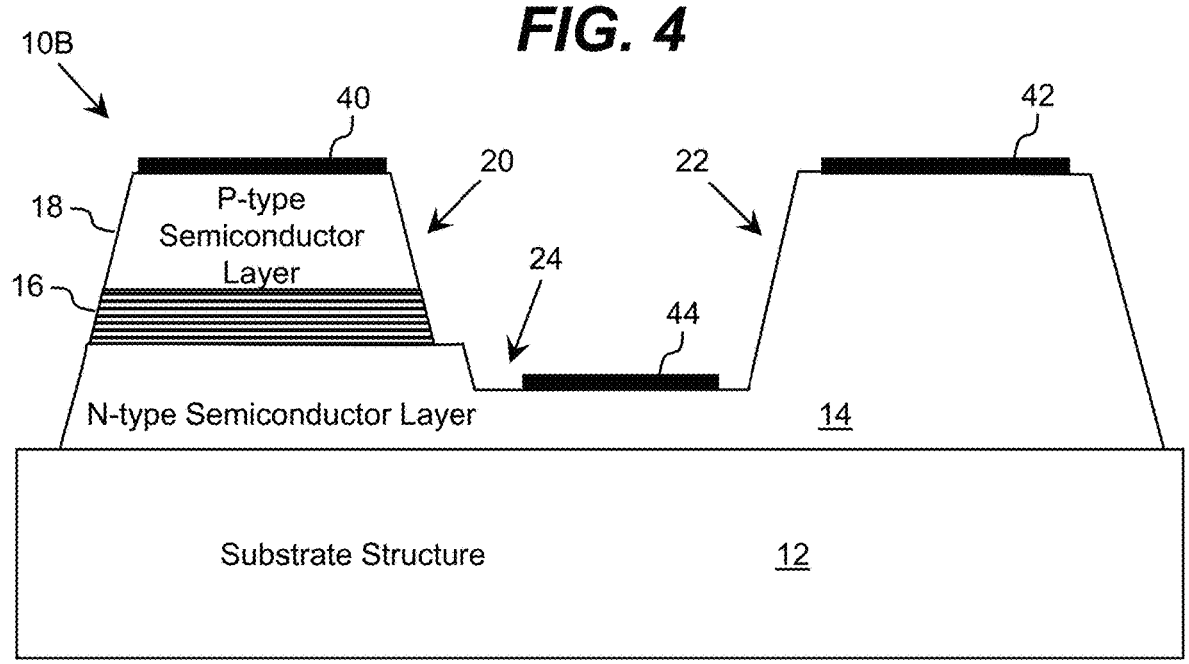
FIG. 4 shows a schematic cross-section view of an illustrative SSLS according to another embodiment.
Figure 5:
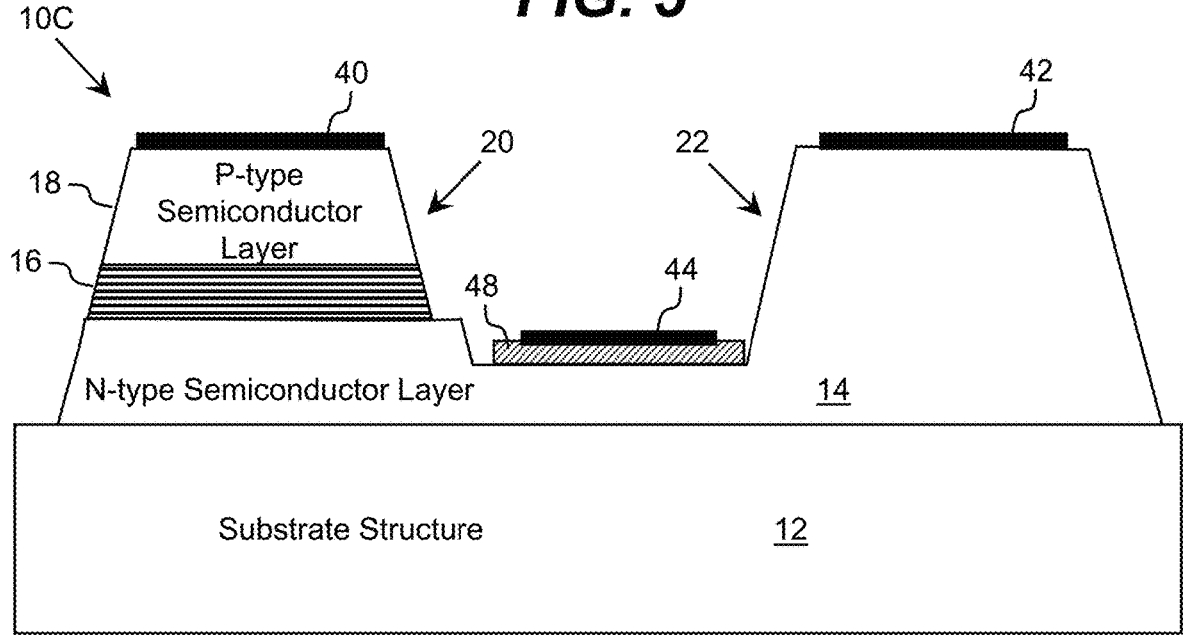
FIG. 5 shows a schematic cross-section view of an illustrative SSLS according to still another embodiment.

FIGS. 4 and 5 show schematic cross-section views of illustrative SSLSs 10B, 10C, respectively, according to other embodiments. As illustrated, the n-type semiconductor layer 14 can be located on a substrate structure 12, which can include a substrate material, one or more buffer layers, and/or the like. Each SSLS 10B, 10C is shown including a p-type mesa 20, which includes an active region 16 located on the n-type semiconductor layer 14, a p-type semiconductor layer 18 located on the active region 16, and the p-type contact 40 located on the p-type semiconductor layer 18. Additionally, each SSLS 10B, 10C is shown including a n-type mesa 22 on which is located a n-type contact 42. As indicated in FIG. 4, a recessed region 24 can be formed in the n-type semiconductor layer 14 such that the n-type semiconductor layer 14 forms a bottom portion of the p-type mesa 20.

In the SSLS 10B, a control electrode 44 is formed directly on the n-type semiconductor layer 14 in the recessed region 24. Alternatively, as illustrated by the SSLS 10C, a control electrode 44 can be formed on an insulating layer 48, which is located directly on the n-type semiconductor layer 14. In an embodiment, the insulating layer 48 can comprise a dielectric material. Regardless, application of a sufficiently high voltage to either control electrode 44 can fully deplete the access region of the n-type semiconductor layer 14 underlying the control electrode 44, thus providing nearly 100% modulation of the light output of the SSLS 10B, 10C.

Using the SSLS 10B as an illustrative device, a voltage required to fully deplete the access region located under the control electrode 44 can be estimated as follows. For a carrier concentration in the access region located under the control electrode 44, n, and a thickness of the n-type semiconductor layer 14 located under the control electrode 44 (which is not necessarily the same as in the remainder of the access region), d, a voltage for 100% light output modulation, $V_M$, is given by:

$$V_M = \frac{qnd^2}{2\varepsilon\varepsilon_0},$$

where q is the electron charge, $\varepsilon_0$ is the dielectric permittivity of a vacuum, and $\varepsilon$ is a relative dielectric permittivity of the semiconductor material forming the n-type semiconductor layer 14 located under the control electrode 44. For an illustrative case where the access region located under the control electrode 44 has a carrier concentration n of $10^{18}$ cm$^{-3}$, a thickness d=0.1 μm, and a relative dielectric permittivity $\varepsilon$=9, the control voltage required for 100% light output modulation $V_M$=10 Volts.

Figure 6:
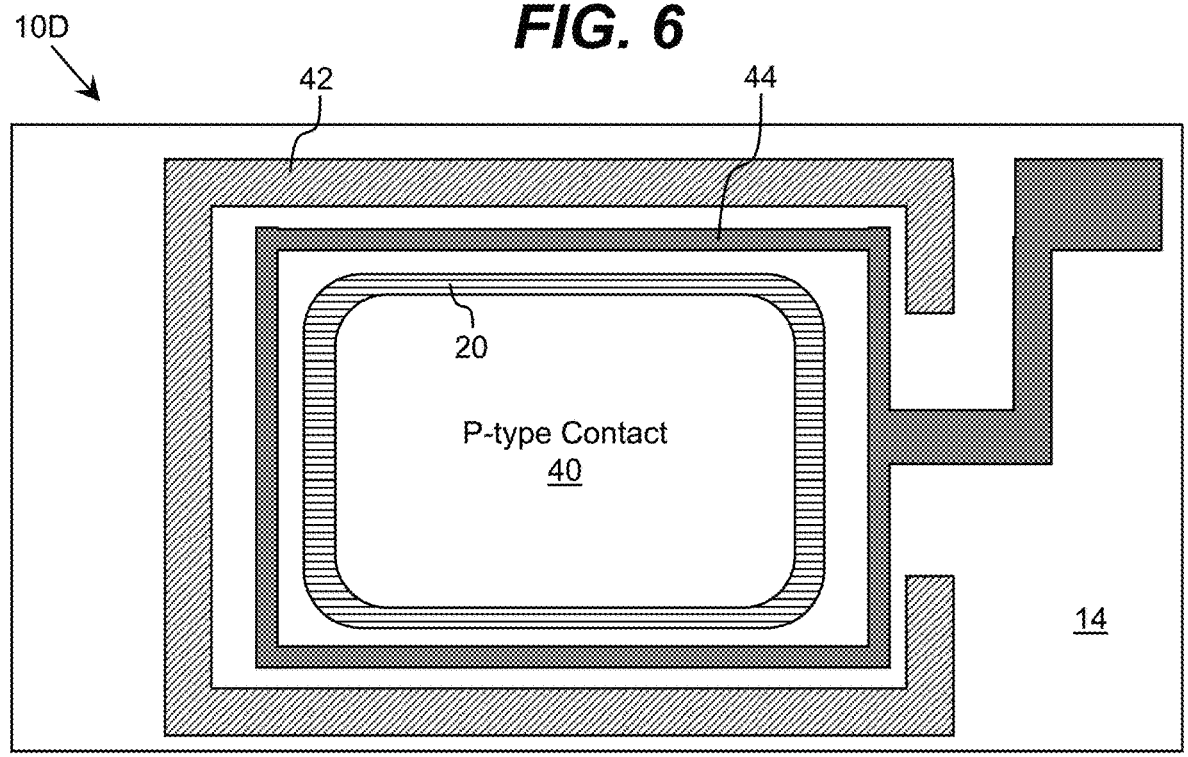
FIG. 6 shows a schematic top view of another illustrative SSLS according to an embodiment.

It is understood that embodiments of the SSLSs described herein can have any of various different layouts. To this extent, FIG. 6 shows a schematic top view of another illustrative SSLS 10D according to an embodiment. In this case, the p-type contact 40 is located on a p-type mesa 20 and is surrounded by a control electrode 44, which is located on the n-type semiconductor layer 14, between the p-type mesa 20 and a n-type contact 42. As illustrated, the n-type contact 42 can comprise a single contact that surrounds at least three sides of the p-type mesa 20 and the control electrode 44. In this configuration, the control electrode 44 can surround all of the active region, which can be located in the p-type mesa 20.

Figure 7:
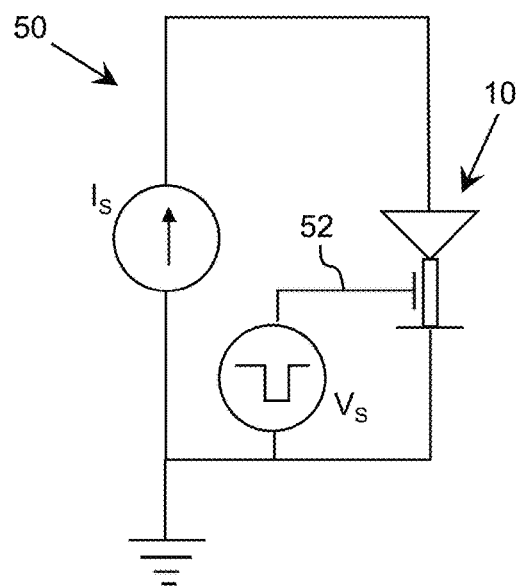
FIG. 7 shows an illustrative diagram of a circuit including a SSLS described herein according to an embodiment.

FIG. 7 shows an illustrative diagram of a circuit 50 including a SSLS 10 described herein according to an embodiment. The SSLS 10 can comprise any embodiment of the SSLSs described herein, including any of the SSLSs 10A-10D. The circuit 50 can be configured to enable light output modulation of the SSLS 10 via current modulation in the SSLS 10. In this case, the circuit 50 includes a current source, $I_S$, which supplies current to the SSLS 10, and a pulsed voltage source, $V_S$, which provides a modulation voltage to the SSLS 10 via a control signal 52, which can be electrically connected to the pad 46 (FIG. 3) of a control electrode 44 described herein.

As illustrated by the circuit 50, no modulation of the SSLS 10 pumping current is required to achieve modulation of the light output of the SSLS 10. Such a configuration is particularly advantageous for operation of a high power SSLS 10 since fast modulation of high currents is challenging. For example, such high power modulation can require rather complex circuits and result in slower modulation rates as compared to electrostatic resistance modulation.

A typical capacitance between the control electrode and the semiconductor, Cc, would be in a range of Cc=1-10 pF for a low- or mid-power SSLS 10 and in a range of Cc=10-100 pF for a high-power SSLS 10. Assuming a typical output resistance of the modulation signal source is $R_i$=50Ω, a time constant for the speed of the light output modulation in the SSLS 10, $\tau_M$, can be calculated as $\tau_M$=$R_i$×Cc=50-500 ps for a low or mid-power SSLS 10, and 0.5-5 ns for a high-power SSLS 10.

Figure 8:
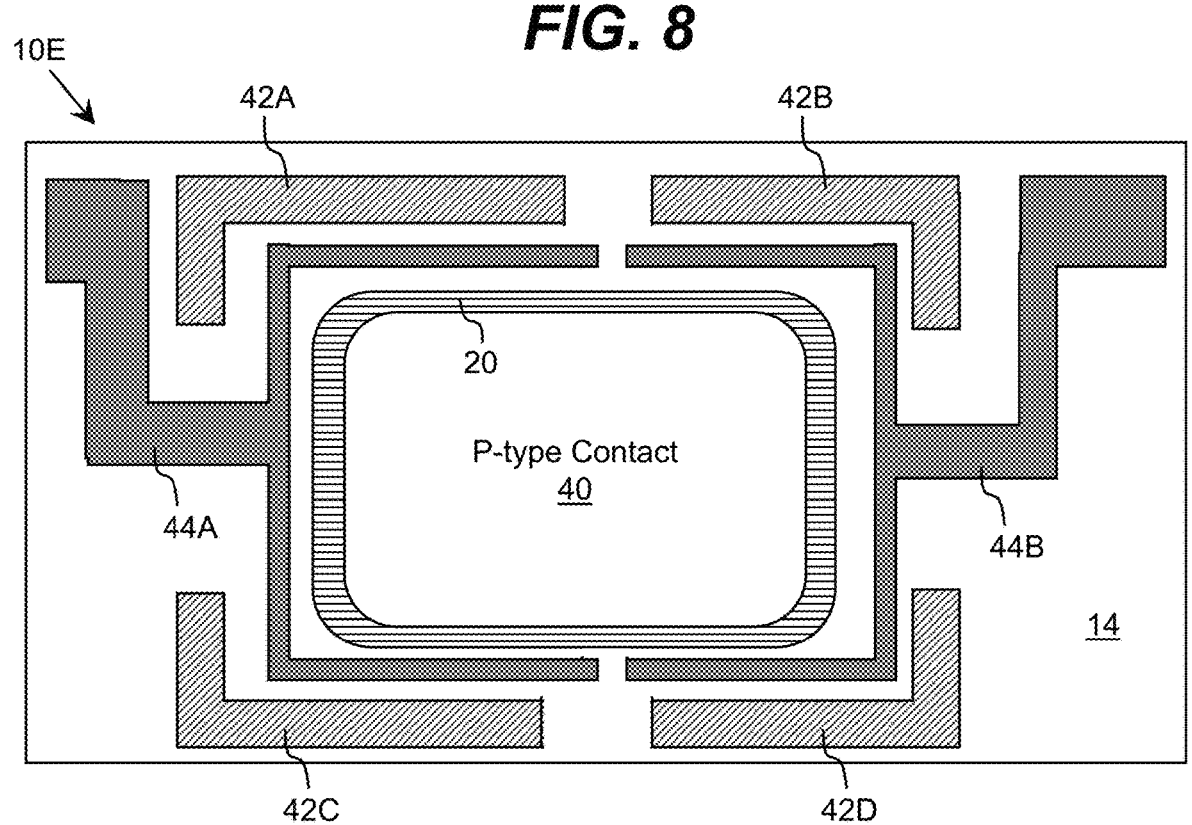
FIG. 8 shows a schematic top view of an illustrative SSLS including multiple control electrodes and multiple n-type contacts according to an embodiment.

Embodiments of the SSLSs described herein can have multiple p-type contacts, n-type contacts, and/or control electrodes arranged in any of various different layouts. For example, FIG. 8 shows a schematic top view of an illustrative SSLS 10E including two control electrodes 44A, 44B, and four n-type contacts 42A-42D according to an embodiment. In this embodiment, resistance between the n-type contacts 42A-42D and the active region located in the p-type mesa 20 can be controlled by the control electrodes 44A, 44B, each of which can have an independent modulation voltage applied thereto.

When multiple control electrodes 44A, 44B are implemented, each portion of the access region in which current spreading occurs between the contact(s) and the active region during operation of the SSLS 10A can have its access resistance controlled by at least one of the control electrodes 44A, 44B. To this extent, as illustrated in SSLS 10E, the control electrode 44A can control the access resistance of the access region located between the n-type contacts 42A, 42C, while the control electrode 44B can control the access resistance of the access region located between the n-type contacts 42B, 42D.

Figure 9:
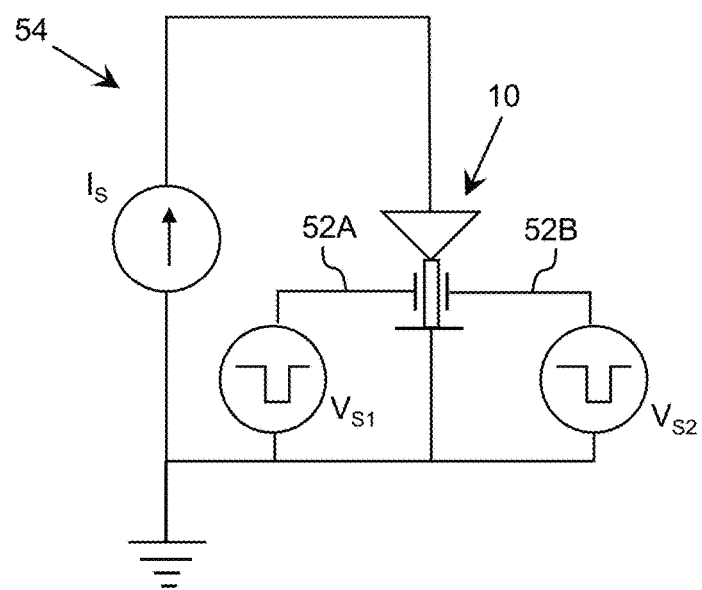
FIG. 9 shows an illustrative diagram of a circuit including a SSLS with multiple control electrodes according to an embodiment.

FIG. 9 shows an illustrative diagram of a circuit 54 including a SSLS 10 with multiple control electrodes according to an embodiment. As illustrated, the circuit 54 can be configured to enable light output modulation of the SSLS 10 via current modulation in the SSLS 10. In this case, the circuit 54 includes a current source, $I_S$, which supplies current to the SSLS 10, and two pulsed voltage sources, $V_{S1}$ and $V_{S2}$, each of which provides an independent modulation voltage to a distinct control electrode of the SSLS 10 via control signals 52A, 52B, respectively. As illustrated by the circuit 54, no modulation of the SSLS 10 pumping current is required to achieve modulation of the light output of the SSLS 10. When the SSLS 10 has a layout similar to the layout of SSLS 10E (FIG. 8), the circuit 54 can provide multiple levels of light output modulation by using modulation voltage pulses with one and the same amplitude.

Figure 10:
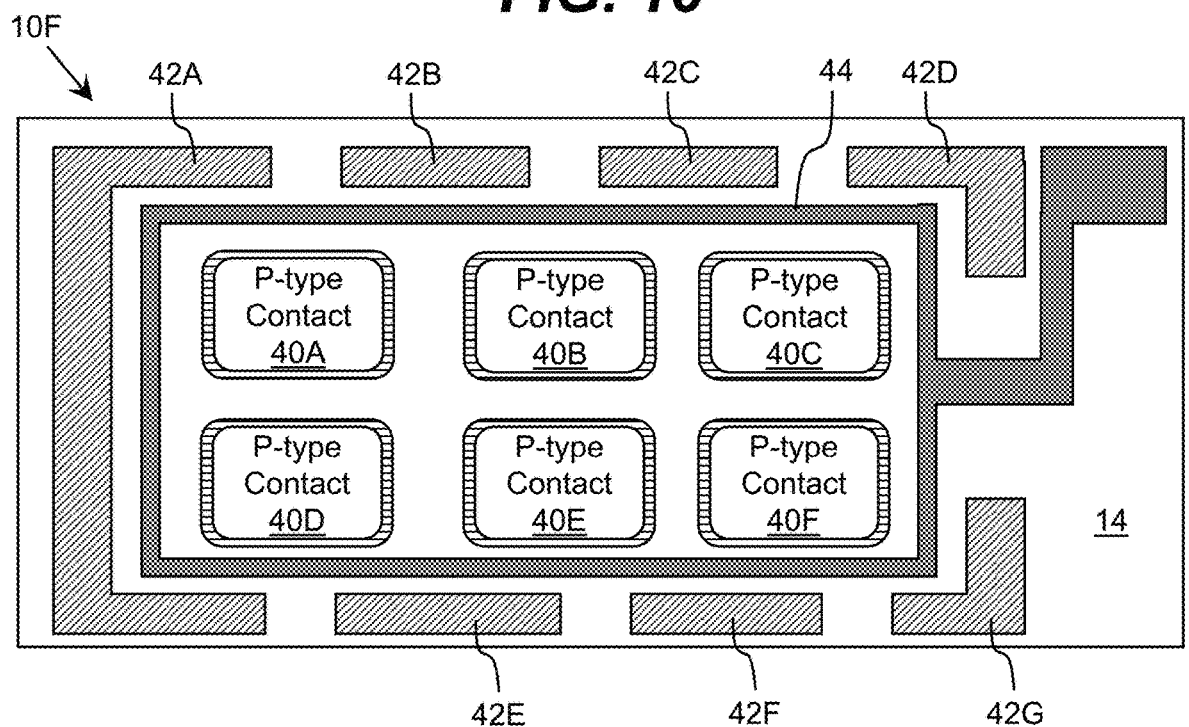
FIG. 10 shows a schematic top view of an illustrative SSLS including a single control electrode with multiple n-type and p-type contacts according to an embodiment.

FIG. 10 shows a schematic top view of an illustrative SSLS 10F including a single control electrode 44 with multiple n-type contacts 42A-42G and p-type contacts 40A-40F according to an embodiment. In this case, the single control electrode 44 can be operated to modulate the access resistance of the access region of the SSLS 10F between all of the n-type contacts 42A-42G and multiple active regions, each of which is located in a mesa located below each of the p-type contacts 40A-40F as described herein. As illustrated, the SSLS 10F includes multiple n-type contacts 42A-42G, which can be collectively operated, independently operated, and/or operated in two or more sub-groups in a circuit to provide multiple distinct pumping currents to the active regions. Similarly, the multiple p-type contacts 40A-40F also can be collectively operated, independently operated, and/or operated in two or more sub-groups in a circuit.

Figure 11:
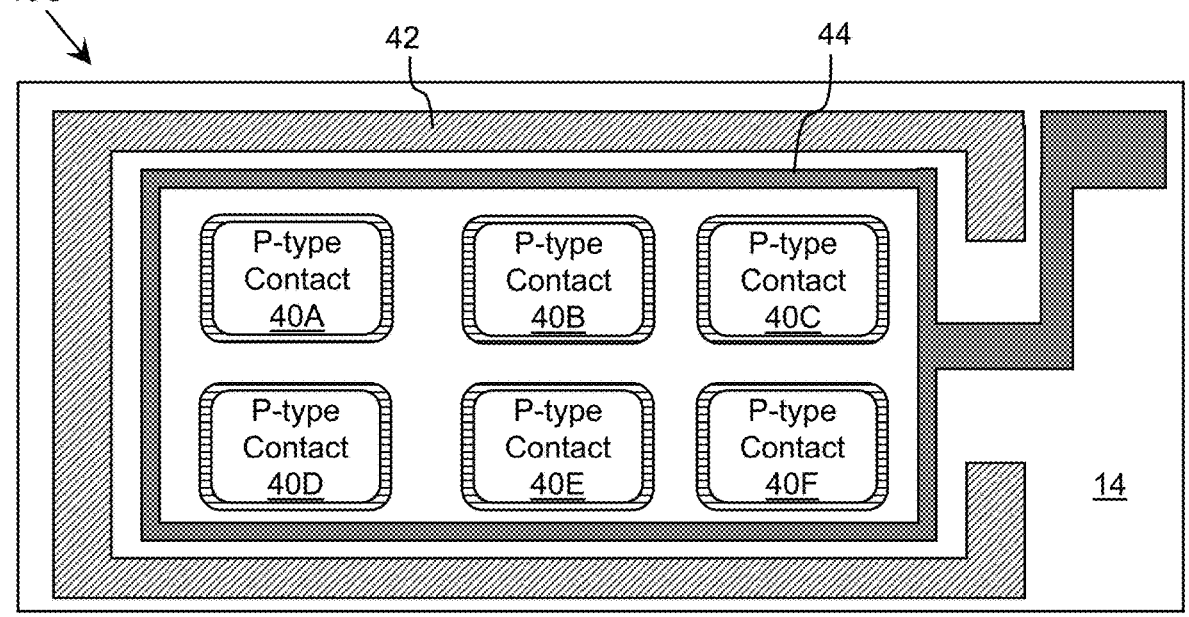
FIG. 11 shows a schematic top view of an illustrative SSLS including a single control electrode and a single n-type contact with multiple p-type contacts according to an embodiment.

FIG. 11 shows a schematic top view of an illustrative SSLS 10G including a single control electrode 44 and a single n-type contact 42 with multiple p-type contacts 40A-40F according to an embodiment. In this case, the single control electrode 44 can be operated to modulate the access resistance of the access region of the SSLS 10G between the n-type contact 42 and multiple active regions, each of which is located in a mesa located below each of the p-type contacts 40A-40F as described herein. To this extent, a circuit can provide a pumping current to all of the active regions via the single n-type contact 42.

While the illustrative SSLSs 10A-10G shown herein have a bottom n-type layer 14 and a top p-type side, it is understood that this configuration is only illustrative. To this extent, in other embodiments, a SSLS described herein can have a bottom p-type layer and a top n-type side. Furthermore, while the control electrodes are illustrated as being placed between the n-type contact (e.g., cathode) and a mesa including an active region, it is understood that this configuration is only illustrative. To this extent, in other embodiments of a SSLS described herein, a control electrode can be placed between the p-type contact (e.g., anode) and a mesa including an active region. Still further, an embodiment of a SSLS described herein can include control electrodes located between both the n-type contact (e.g., cathode) and an active region and the p-type contact (e.g., anode) and the active region.

Figure 12:
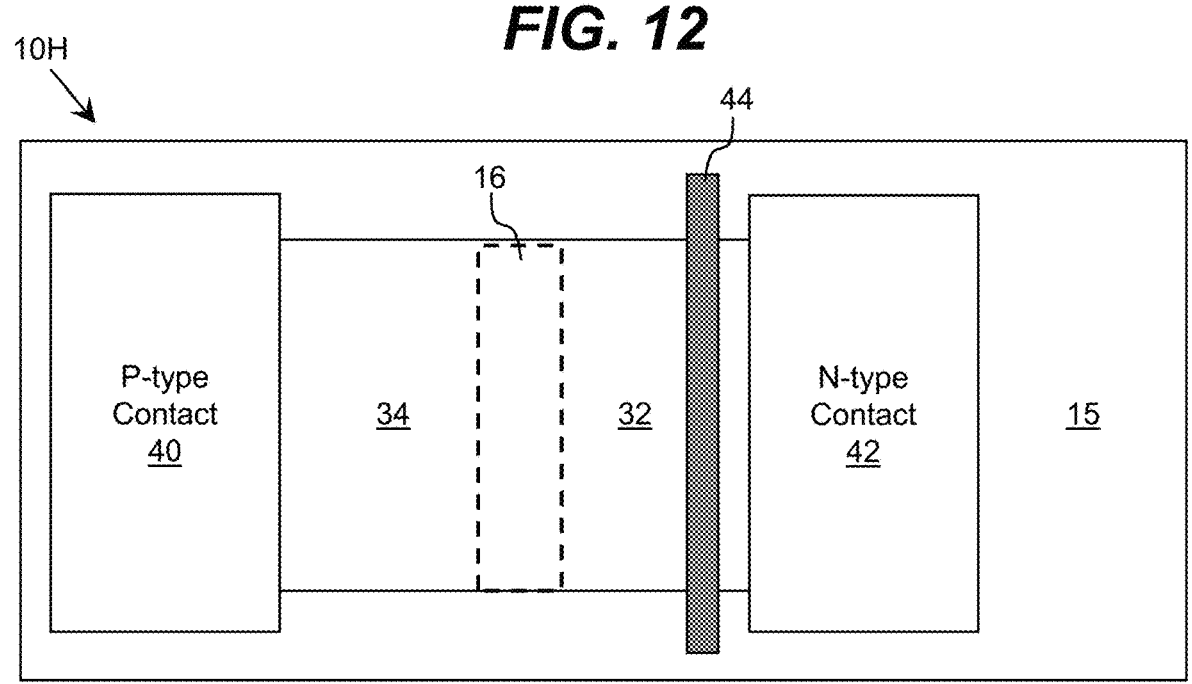
FIG. 12 shows a schematic top view of an illustrative planar SSLS according to an embodiment.

Additionally, embodiments of a SSLS described herein also can have a planar (lateral) geometry. For example, FIG. 12 shows a schematic top view of an illustrative planar SSLS 10H according to an embodiment. In this case, the SSLS 10H includes a semiconductor layer 15 including a n-type access region 32 and a p-type access region 34, and an active region 16 formed in a plane there between. The semiconductor layer 15 can comprise any suitable semiconductor material, such as a group III-V semiconductor material described herein, with correspondingly n-type and p-type doped regions. Additionally, the semiconductor layer 15 could comprise two or more distinct semiconductor materials, such as different semiconductor materials for the n-type access region 32 and the p-type access region 34. A p-type contact 40 is formed directly over a portion of the p-type access region 34, while a n-type contact 42 is formed directly over the n-type access region 32. As illustrated, the SSLS 10H includes a control electrode 44, which can be operated to modulate the access resistance of the n-type access region 32 of the SSLS 10H, located between the n-type contact 42 and the active region 16.

Figure 13:
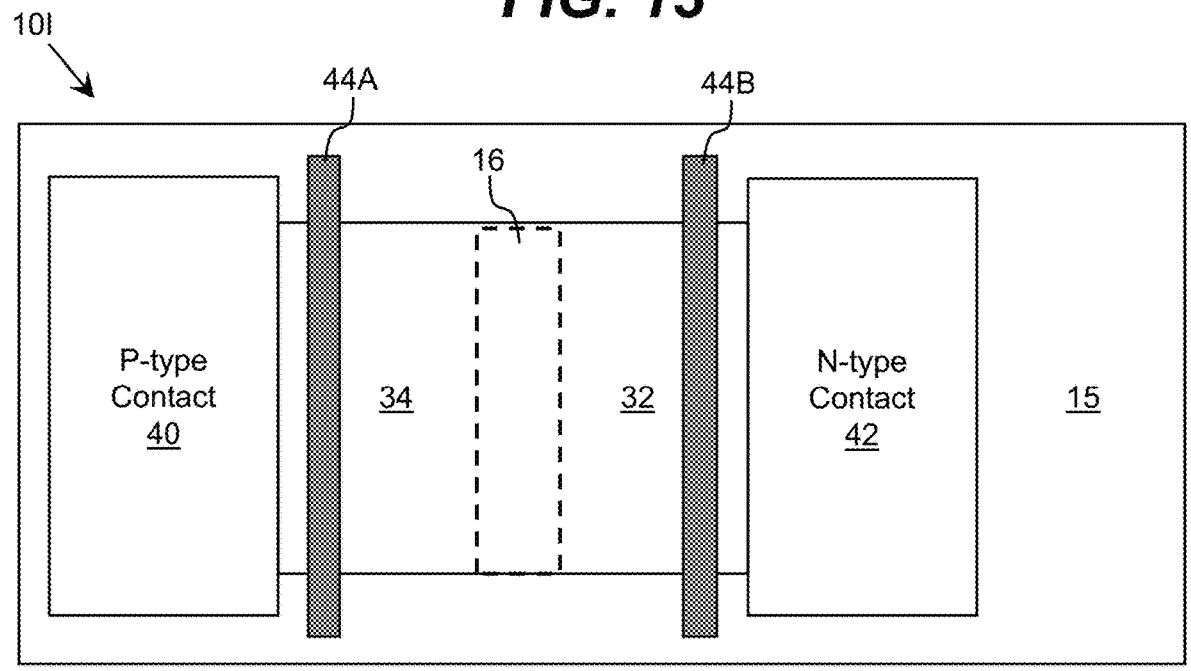
FIG. 13 shows a schematic top view of another illustrative planar SSLS according to an embodiment.

While the control electrode 44 is shown located on the n-type access region 32 between the n-type contact 42 and the active region 16, it is understood that this is only illustrative and other configurations are possible. For example, FIG. 13 shows a schematic top view of another illustrative planar SSLS 10I according to an embodiment. In this case, the SSLS 10I includes two control electrodes 44A, 44B. The control electrode 44A can be operated to modulate the access resistance of the p-type access region 34 of the SSLS 10I, located in the semiconductor layer 15 between the p-type contact 40 and the active region 16, while the control electrode 44B can be operated to modulate the access resistance of the n-type access region 32 of the SSLS 10I, located in the semiconductor layer 15 between the n-type contact 42 and the active region 16. A circuit including the SSLS 10I can include multiple voltage sources, each of which provides an independent modulation voltage to a distinct control electrode 44A, 44B of the SSLS 10I or a single voltage source, which provides a modulation voltage to both control electrodes 44A, 44B.

The SSLSs shown and described herein can be fabricated using any type of semiconductor materials. Considering the SSLS 10C shown in FIG. 5 as an illustrative embodiment, the n-type semiconductor layer 14, the active region 16, and the p-type semiconductor layer 18 can be formed of semiconductor materials from the same materials system. For example, the semiconductor material system can be a group III-V material system, in which some or all of the various layers 14, 16, 18 are formed of a subset of materials in the group III-V materials system. In a still more particular illustrative embodiment, the various layers of a SSLS described herein are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based active region 16 (light generating structure) that includes a multi-quantum well (e.g., a series of alternating quantum wells and barriers) can comprise $In_yAl_xGa_{1-x-y}N$, $Ga_zIn_yAl_xB_{1-x-y-z}N$, an $Al_xGa_{1-x}N$ semiconductor alloy, or the like. Similarly, both the n-type semiconductor layer 14 and the p-type semiconductor layer 18 and can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 14, 16, and 18. However, it is understood that the semiconductor layers 14, 16, 18 can be formed of other semiconductor materials, such as other group III-V materials. Other illustrative group III-V materials include group III arsenide materials (e.g., GaAs, GaInAs, etc.) and group III phosphide materials (e.g., GaInP, etc.).

In embodiment, the substrate structure 12 can include a substrate material and one or more buffer layers. The substrate material can be insulating or conducting. Illustrative substrate materials include sapphire, silicon carbide (SiC), silicon (Si), bulk GaN, bulk AlN, bulk or a film of AlGaN, bulk or a film of BN, AlON, $LiGaO_2$, $LiAlO_2$, aluminum oxinitride ($AlO_xN_y$), $MgAl_2O_4$, GaAs, Ge, or another suitable material. Examples of non-conductive or insulating substrate can include highly-resistive silicon, insulating SiC, sapphire, diamond, a dielectric material, organic materials, and/or the like. The buffer layer(s) can be formed of a semiconductor material configured to provide a quality growth surface for subsequent growth of the semiconductor layers 14, 16, 18 thereon. For growth of group III nitride layers, the buffer layer(s) can be composed of AlN, an AlGaN/AlN superlattice, and/or the like.

The insulating layer 48 can comprise any suitable type of dielectric/insulating material. Examples of dielectric material 48 include, but are not limited to, $SiO_2$, $Si_3N_4$, $Al_2O_3$, and/or the like. In another embodiment, the insulating layer 48 can comprise a heterostructure or a multilayer structure containing semiconductor and/or dielectric materials. Examples of such heterostructures and multilayer structures include but are not limited to, AlN/AlGaN, AlGaN/AlN superlattice, AlN/AlInGaN, AlN/AlInGaN superlattice, and/or the like. Additionally, the contacts 40, 42 and electrode 44 can be fabricated of any suitable material. In an embodiment, the contact 40, 42 and electrode 44 are fabricated of one or more metals. Illustrative metals include, but are not limited to, Al, Ni, Au, Mo, etc.

Regardless, it is understood that the heterostructures shown and described herein are only illustrative. To this extent, a SSLS described herein can be configured with additional layers, different configurations of layers, and/or the like. For example, while only the SSLS 10C is shown including an insulating layer 48 located between the control electrode 44 and the underlying semiconductor layer, it is understood that any of the control electrodes shown and described herein can be formed on an insulating layer 48. Additionally, a SSLS described herein can be encapsulated by one or more materials, e.g., to prevent breakdown, improve light extraction, and/or the like.

Figure 14:
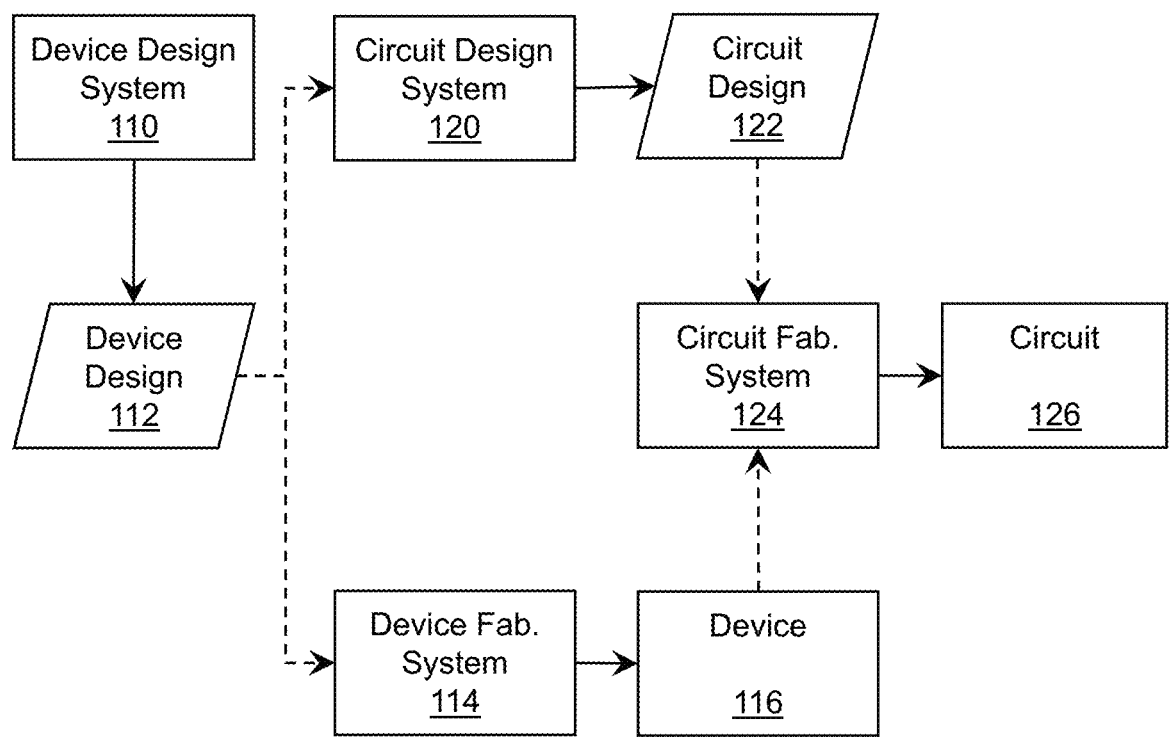
FIG. 14 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 14 shows an illustrative flow diagram for fabricating a circuit 126 according to an embodiment. Initially, a user can utilize a device design system 110 to generate a device design 112 for a semiconductor device (i.e., a SSLS) as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A solid-state light source comprising:
   an active region configured to emit electromagnetic radiation during operation of the light source;
   an n-type contact located on an n-type side of the active region and separated from the active region by an n-type access region;
   a p-type contact located on a p-type side of the active region and separated from the active region by a p-type access region, wherein the active region and one of the n-type access region and n-type contact or the p-type access region and p-type contact, are located in a first mesa located on a surface of the other one of: the n-type access region or the p-type access region; and
   a control electrode configured to modulate an access resistance of the other one of: the n-type access region or the p-type access region, wherein the control electrode is formed on the surface of the other one of: the n-type access region or the p-type access region within a recessed region of the surface.

2. The light source of claim 1, wherein the other one of: the n-type contact or the p-type contact, is located on a second mesa, distinct from the first mesa, located on the surface of the other one of: the n-type access region or the p-type access region.

3. The light source of claim 1, further comprising a dielectric layer located between the control electrode and the only one of: the n-type access region or the p-type access region.

4. The light source of claim 1, wherein the control electrode surrounds the first mesa including the active region.

5. The light source of claim 1, wherein the control electrode has at least one dimension that extends at least over an entire portion of the only one of: the n-type access region or the p-type access region, in which current spreading occurs.

6. The light source of claim 1, further comprising a second control electrode configured to modulate at least one of: the access resistance of the n-type access region or the access resistance of the p-type access region.

7. The light source of claim 6, wherein each control electrode modulates a different one of: the access resistance of the n-type access region and the access resistance of the p-type access region.

8. The light source of claim 1, wherein the first mesa is formed above one of: a surface of a n-type semiconductor layer located on a n-type side of the active region or a surface of a p-type semiconductor layer located on a p-type side of the active region.

9. The light source of claim 1, wherein the active region is further located in at least one additional mesa formed on the surface of the other one of: the n-type access region or the p-type access region.

10. The light source of claim 8, wherein the n-type semiconductor layer, the active region, and the p-type semiconductor layer are formed of group III nitride materials.

11. The light source of claim 1, wherein the active region is located in a plane between the n-type access region for the n-type contact and the p-type access region for the p-type contact.

12. A solid-state light source comprising:
a first semiconductor layer;
an active region configured to emit electromagnetic radiation during operation of the light source, the active region located only on a first portion of a surface of the first semiconductor layer;
a second semiconductor layer located on the active region, wherein the first semiconductor layer is one of: an n-type semiconductor or a p-type semiconductor, and wherein the second semiconductor layer is the other of: the n-type semiconductor or the p-type semiconductor;
a control electrode structure configured to modulate an access resistance of an access region of the first semiconductor layer; and
a first contact located only on a second portion of the surface of the first semiconductor layer distinct from the first portion, wherein the control electrode structure is located directly on the surface between the first portion and the second portion of the first semiconductor layer.

13. The light source of claim 12, wherein the control electrode structure surrounds at least one mesa including the active region.

14. The light source of claim 12, wherein the control electrode structure is located in a recessed region of the surface of the first semiconductor layer.

15. The light source of claim 12, wherein the control electrode structure comprises an insulating layer, wherein the insulating layer is located on the access region of the first semiconductor layer.

16. The light source of claim 12, wherein the first semiconductor layer, the active region, and the second semiconductor layer are formed of group III nitride materials.

17. A solid-state light source comprising:
a semiconductor layer;
an active region formed in the semiconductor layer, wherein the active region is configured to emit electromagnetic radiation during operation of the light source;
an n-type contact located on a first surface of the semiconductor layer on an n-type side of the active region and separated from the active region by an n-type access region formed in the semiconductor layer;
a p-type contact located on the first surface of the semiconductor layer on a p-type side of the active region and separated from the active region by a p-type access region formed in the semiconductor layer; and
a first control electrode configured to modulate an access resistance of only one of: the n-type access region or the p-type access region, the first control electrode located laterally to the active region at one of: the n-type side or the p-type side of the active region; and
a second control electrode configured to modulate the access resistance of only the other of: the n-type access region or the p-type access region, the second control electrode located laterally to the active region at the other of: the n-type side or the p-type side of the active region of which the first control electrode is laterally located therefrom.

18. The light source of claim 17, further comprising a dielectric layer located between at least one of: the first control electrode or the second control electrode, and the corresponding one of: the n-type access region or the p-type access region.

19. The light source of claim 17, wherein the active region is located in a plane between the n-type access region for the n-type contact and the p-type access region for the p-type contact.

20. The light source of claim 17, wherein at least one of: the first control electrode or the second control electrode, has at least one dimension that extends at least over an entire portion of the corresponding one of: the n-type access region or the p-type access region, in which current spreading occurs.

* * * * *